(12) United States Patent
Liu et al.

(10) Patent No.: US 12,278,242 B2
(45) Date of Patent: Apr. 15, 2025

(54) ARRAY SUBSTRATE, DISPLAY PANEL, AND MANUFACTURING METHOD OF ARRAY SUBSTRATE

(71) Applicant: SHENZHEN CHINA STAR OPTOELECTRONICS SEMICONDUCTOR DISPLAY TECHNOLOGY CO., LTD., Shenzhen (CN)

(72) Inventors: Yang Liu, Shenzhen (CN); Deyan Li, Shenzhen (CN); Jun Yi, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/296,233

(22) PCT Filed: Apr. 23, 2021

(86) PCT No.: PCT/CN2021/089326
§ 371 (c)(1),
(2) Date: Oct. 20, 2022

(87) PCT Pub. No.: WO2022/217639
PCT Pub. Date: Oct. 20, 2022

(65) Prior Publication Data
US 2024/0030227 A1    Jan. 25, 2024

(30) Foreign Application Priority Data
Apr. 14, 2021 (CN) .......................... 202110397636.4

(51) Int. Cl.
*G02F 1/1362* (2006.01)
*G02F 1/1368* (2006.01)
*H01L 27/12* (2006.01)

(52) U.S. Cl.
CPC ...... *H01L 27/124* (2013.01); *G02F 1/136222* (2021.01); *G02F 1/136286* (2013.01);
(Continued)

(58) Field of Classification Search
CPC .............. H01L 27/124; H01L 27/1255; H01L 27/1262; G02F 1/136222; G02F 1/136286; G02F 1/1368
See application file for complete search history.

(56) References Cited

U.S. PATENT DOCUMENTS

2004/0196228 A1   10/2004   Ahn
2004/0207785 A1   10/2004   Jang et al.
(Continued)

FOREIGN PATENT DOCUMENTS

CN         1841150 A      10/2006
CN       101075054 A      11/2007
(Continued)

*Primary Examiner* — James A Dudek
(74) *Attorney, Agent, or Firm* — PV IP PC; Wei Te Chung

(57) ABSTRACT

An array substrate, a display panel, and a manufacturing method of the array substrate are provided, including a thin film transistor layer, a passivation layer, and a pixel electrode layer which are sequentially disposed on one above another. The passivation layer is provided with a first via hole and a second via hole staggered from each other. The pixel electrode layer includes a pixel electrode connected to a first conductive layer through the first via hole and the second via hole. Therefore, a problem of grayscale dark spots caused by the pixel electrode being broken at a connection point with the first conductive layer is avoided.

20 Claims, 8 Drawing Sheets

(52) U.S. Cl.
CPC ........ *G02F 1/1368* (2013.01); *H01L 27/1255* (2013.01); *H01L 27/1262* (2013.01)

(56) References Cited

U.S. PATENT DOCUMENTS

| | | | |
|---|---|---|---|
| 2013/0009160 A1* | 1/2013 | Katsui | H01L 27/1248 |
| | | | 257/59 |
| 2015/0205152 A1 | 7/2015 | Bang et al. | |
| 2015/0227014 A1 | 8/2015 | Jung et al. | |
| 2016/0291367 A1 | 10/2016 | Cheng et al. | |
| 2017/0219890 A1 | 8/2017 | Li et al. | |
| 2019/0227397 A1 | 7/2019 | Wang et al. | |

FOREIGN PATENT DOCUMENTS

| | | |
|---|---|---|
| CN | 101770130 A | 7/2010 |
| CN | 103346160 A | 10/2013 |
| CN | 104793358 A | 7/2015 |
| CN | 104849902 A | 8/2015 |
| CN | 106158882 A | 11/2016 |
| CN | 106842728 A | 6/2017 |
| CN | 207165572 U | 3/2018 |
| KR | 20020087738 A | 11/2002 |
| WO | 2019205602 A1 | 10/2019 |

\* cited by examiner

ARRAY SUBSTRATE, DISPLAY PANEL, AND MANUFACTURING METHOD OF ARRAY SUBSTRATE

RELATED APPLICATIONS

This application is a Notional Phase of PCT Patent Application No. PCT/CN2021/089326 having international filing date of Apr. 23, 2021, which claims the benefit of priority of Chinese Patent Application No. 202110397636.4 filed on Apr. 14, 2021. The contents of the above applications are all incorporated by reference as if fully set forth herein in their entirety.

FIELD OF DISCLOSURE

The present disclosure relates to the field of display technologies, in particular to an array substrate, a display panel, and a manufacturing method of an array substrate.

BACKGROUND

Thin film transistor (TFT) liquid crystal display panels have advantages of small size, high contrast, etc., and their applications are getting wider. A pixel electrode layer in the TFT liquid crystal display panel is made of an indium tin oxide (ITO) film. The ITO film is connected to a metal electrode layer in the TFT liquid crystal display panel through a via hole. However, in the existing TFT liquid crystal display panel, a connection point between the ITO film and the metal electrode layer is prone to breakage, or the formed film is of poor quality, resulting in poor connection between the pixel electrode layer and the metal electrode layer. Thus, grayscale dark spots appear in the display panel, which affects a quality of the display panel.

SUMMARY OF DISCLOSURE

The present disclosure provides a manufacturing method of an array substrate, a display panel, and a manufacturing method of an array substrate, to solve a problem of grayscale dark spots prone to appear in an existing TFT liquid crystal display panel.

In one aspect, an embodiment of the present disclosure provided an array substrate, including:
  a substrate;
  a thin film transistor layer disposed on the substrate, where the thin film transistor layer includes a thin film transistor assembly, the thin film transistor assembly includes at least one thin film transistor, and the thin film transistor is electrically connected to a first conductive layer;
  a passivation layer disposed on the thin film transistor layer, where the passivation layer includes a thin film transistor region corresponding to the thin film transistor, and the passivation layer is provided with a first via hole and a second via hole in the thin film transistor region; and
  a pixel electrode layer disposed on the passivation layer, where the pixel electrode layer includes a pixel electrode.

The pixel electrode is connected to the first conductive layer through the first via hole and the second via hole.

Alternatively, the array substrate further includes a color filter layer disposed on the pixel electrode layer. The color filter layer is provided with an opening. The first via hole corresponds to the opening, and the second via hole is staggered from the opening.

Alternatively, the thin film transistor assembly includes a first thin film transistor and a second thin film transistor, the thin film transistor region includes a first sub-region corresponding to the first thin film transistor and a second sub-region corresponding to the second thin film transistor, and the pixel electrode includes a first sub-pixel electrode and a second sub-pixel electrode.

The passivation layer is provided with the first via hole and the second via hole in the first sub-region, and the first sub-pixel electrode is connected to the first conductive layer through the first via hole and the second via hole in the first sub-region; and/or
  the passivation layer is provided with the first via hole and the second via hole in the second sub-region, and the second sub-pixel electrode is connected to the first conductive layer through the first via hole and the second via hole in the second sub-region.

Alternatively, the first thin film transistor and the second thin film transistor are correspondingly electrically connected to a second conductive layer, and the second conductive layer is disposed between the substrate and the first conductive layer.

The first conductive layer corresponding to the first thin film transistor includes a first electrode, the second conductive layer corresponding to the first thin film transistor includes a second electrode, a first storage capacitor is formed between the first electrode and the second electrode, and the first storage capacitor is disposed in the first sub-region and corresponds to a position of the first via hole.

Alternatively, the first conductive layer corresponding to the second thin film transistor includes a third electrode, the second conductive layer corresponding to the second thin film transistor includes a fourth electrode, a second storage capacitor is formed between the third electrode and the fourth electrode, and the second storage capacitor is disposed in the second sub-region and corresponds to the position of the first via hole.

Alternatively, the first conductive layer corresponding to the first thin film transistor also includes a first connection line disposed in the first sub-region, one end of the first connection line is electrically connected to a drain of the first thin film transistor, and another end of the first connection line is electrically connected to the first sub-pixel electrode through the first via hole and the second via hole in the first sub-region.

The first conductive layer corresponding to the second thin film transistor also includes a second connection line disposed in the second sub-region, one end of the second connection line is electrically connected to a drain of the second thin film transistor, and another end of the second connection line is electrically connected to the second sub-pixel electrode through the first via hole and the second via hole in the second sub-region.

Alternatively, the pixel electrode layer includes a plurality of first conductive lines electrically connected to the first sub-pixel electrode, and the first sub-pixel electrode is connected to the first conductive layer of the first thin film transistor through at least two of the first conductive lines.

Alternatively, the pixel electrode layer includes a plurality of second conductive lines electrically connected to the second sub-pixel electrode, and the second sub-pixel electrode is connected to the first conductive layer of the second thin film transistor through at least two of the second conductive lines.

Alternatively, a source and a drain of the first thin film transistor and the first conductive layer are arranged on a same layer; and/or a source and a drain of the second thin film transistor and the first conductive layer are arranged on a same layer.

Alternatively, a thickness of the first conductive layer is greater than or equal to 430 nanometers.

Alternatively, a gate of the first thin film transistor and the second conductive layer are arranged on a same layer; and/or a gate of the second thin film transistor and the second conductive layer are arranged on a same layer.

Alternatively, a depth of the second via hole is less than or equal to a depth of the first via hole.

In another aspect, the present disclosure provides a display panel including an array substrate. The array substrate includes:

a substrate;
a thin film transistor layer disposed on the substrate, where the thin film transistor layer includes a thin film transistor assembly, the thin film transistor assembly includes at least one thin film transistor, and the thin film transistor is electrically connected to a first conductive layer;
a passivation layer disposed on the thin film transistor layer, where the passivation layer includes a thin film transistor region corresponding to the thin film transistor, and the passivation layer is provided with a first via hole and a second via hole in the thin film transistor region; and
a pixel electrode layer disposed on the passivation layer, where the pixel electrode layer includes a pixel electrode, and the pixel electrode is connected to the first conductive layer through the first via hole and the second via hole.

Alternatively, the array substrate further includes a color filter layer disposed on the pixel electrode layer. The color filter layer is provided with an opening. The first via hole corresponds to the opening, and the second via hole is staggered from the opening.

Alternatively, the thin film transistor assembly includes a first thin film transistor and a second thin film transistor, the thin film transistor region includes a first sub-region corresponding to the first thin film transistor and a second sub-region corresponding to the second thin film transistor, and the pixel electrode includes a first sub-pixel electrode and a second sub-pixel electrode.

The passivation layer is provided with the first via hole and the second via hole in the first sub-region, and the first sub-pixel electrode is connected to the first conductive layer through the first via hole and the second via hole in the first sub-region; and/or the passivation layer is provided with the first via hole and the second via hole in the second sub-region, and the second sub-pixel electrode is connected to the first conductive layer through the first via hole and the second via hole in the second sub-region.

Alternatively, the first thin film transistor and the second thin film transistor are correspondingly electrically connected to a second conductive layer, and the second conductive layer is disposed between the substrate and the first conductive layer.

The first conductive layer corresponding to the first thin film transistor includes a first electrode, the second conductive layer corresponding to the first thin film transistor includes a second electrode, a first storage capacitor is formed between the first electrode and the second electrode, and the first storage capacitor is disposed in the first sub-region and corresponds to a position of the first via hole.

Alternatively, the first conductive layer corresponding to the second thin film transistor includes a third electrode, the second conductive layer corresponding to the second thin film transistor includes a fourth electrode, a second storage capacitor is formed between the third electrode and the fourth electrode, and the second storage capacitor is disposed in the second sub-region and corresponds to the position of the first via hole.

Alternatively, the first conductive layer corresponding to the first thin film transistor also includes a first connection line disposed in the first sub-region, one end of the first connection line is electrically connected to a drain of the first thin film transistor, and another end of the first connection line is electrically connected to the first sub-pixel electrode through the first via hole and the second via hole in the first sub-region.

The first conductive layer corresponding to the second thin film transistor also includes a second connection line disposed in the second sub-region, one end of the second connection line is electrically connected to a drain of the second thin film transistor, and another end of the second connection line is electrically connected to the second sub-pixel electrode through the first via hole and the second via hole in the second sub-region.

Alternatively, the pixel electrode layer includes a plurality of first conductive lines electrically connected to the first sub-pixel electrode, and the first sub-pixel electrode is connected to the first conductive layer of the first thin film transistor through at least two of the first conductive lines.

In another aspect, and embodiment of the present disclosure provides a manufacturing method of an array substrate, including steps of:

providing a substrate;
forming a thin film transistor layer on the substrate, where the thin film transistor layer includes a thin film transistor, and the thin film transistor is electrically connected to a first conductive layer;
forming a passivation layer on the thin film transistor layer, where the passivation layer includes a thin film transistor region corresponding to the thin film transistor;
forming a first via hole and a second via hole in the thin film transistor region of the passivation layer; and
forming a pixel electrode layer on the passivation layer, where the pixel electrode layer includes a pixel electrode, and the pixel electrode is connected to the first conductive layer through the first via hole and the second via hole.

The array substrate of the present disclosure includes the substrate, the thin film transistor layer, the passivation layer, the pixel electrode layer, and the color filter layer which are sequentially disposed one above another. The thin film transistor layer includes at least one thin film transistor, and the thin film transistor includes the first conductive layer. The passivation layer includes the thin film transistor region corresponding to the thin film transistor, and the passivation layer is provided with the first via hole and the second via hole in the thin film transistor region. The pixel electrode layer includes the pixel electrode. The color filter layer is provided with the opening. The first via hole corresponds to the opening, and the second via hole is staggered from the opening. The pixel electrode is connected to the first conductive layer through the first via hole and the second via hole. By forming the first via hole and the second via hole on the passivation layer, and by connecting the pixel electrode to the first conductive layer through the two via holes, an electrical connection between the pixel electrode and the first conductive layer is ensured, and a problem of grayscale dark spots caused by a breakage of the pixel electrode at a connection point with the first conductive layer is avoided.

BRIEF DESCRIPTION OF DRAWINGS

With reference to accompanying drawings, through a detailed description of specific implementations of the present disclosure, technical solutions and other advantages of the present disclosure will be apparent.

Figure 1:
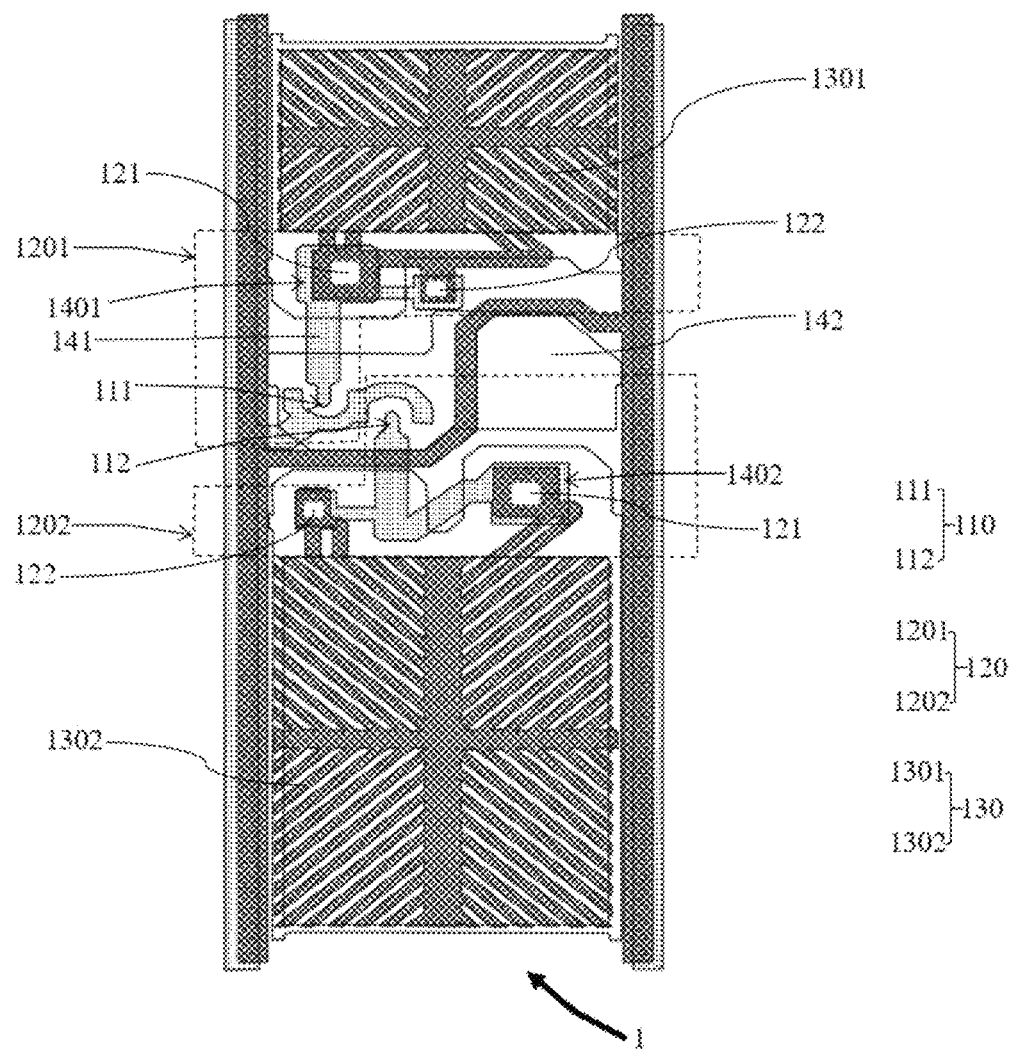
FIG. 1 is a schematic diagram of a first planar structure of an array substrate of an embodiment of the present disclosure.

Reference numerals and elements are as follows.

1 array substrate; 10 substrate
11 thin film transistor layer; 110 thin film transistor assembly
111 first thin film transistor; 112 second thin film transistor
12 passivation layer; 120 thin film transistor region
1201 first sub-region; 1202 second sub-region
121 first via hole; 122 second via hole
13 pixel electrode layer; 130 pixel electrode
1301 first sub-pixel electrode; 1302 second sub-pixel electrode
15 color filter layer; 150 opening
141 first conductive layer; 142 second conductive layer
1411 first electrode; 1412 second electrode
1401 first storage capacitor; 1413 third electrode
1414 fourth electrode; 1402 second storage capacitor
1415a first connection line; a first end
b second end 1311; first conductive line
1415b second connection line; 1312 second conductive line
1421 gate common electrode line; 1421a first gate common electrode line
1421b second gate common electrode line; 1422 scan line
1416 data line; 1101 gate
1102 drain; 1103 source
1104 gate insulating layer; 1105 active layer
2 color filter substrate; 3 liquid crystal layer
4 display panel

DETAILED DESCRIPTION

The technical solutions in the embodiments of the present disclosure will be clearly and completely described below in conjunction with the drawings in the embodiments of the present disclosure. Apparently, the described embodiments are only a part of the embodiments of the present disclosure, rather than all of the embodiments. Based on the embodiments in the present disclosure, all other embodiments obtained by those skilled in the art without creative effort shall fall within a protection scope of the present disclosure. Furthermore, it should be understood that the specific embodiments described here are only used to illustrate and explain the present disclosure, and are not used to limit the present disclosure. In the present disclosure, orientation terms such as "upper" and "lower" usually refer to upper and lower sides of devices in actual use or working state, and specifically refer to the drawing directions in the drawings, unless specified otherwise. Also, terms such as "inner" and "outer" refer to an outline of the devices.

The embodiments of the present disclosure provide an array substrate, a display panel, and a manufacturing method of an array substrate, which will be described in detail below. It should be noted that a description order of following embodiments is not intended to limit a preferred order of the embodiments.

Figure 2:
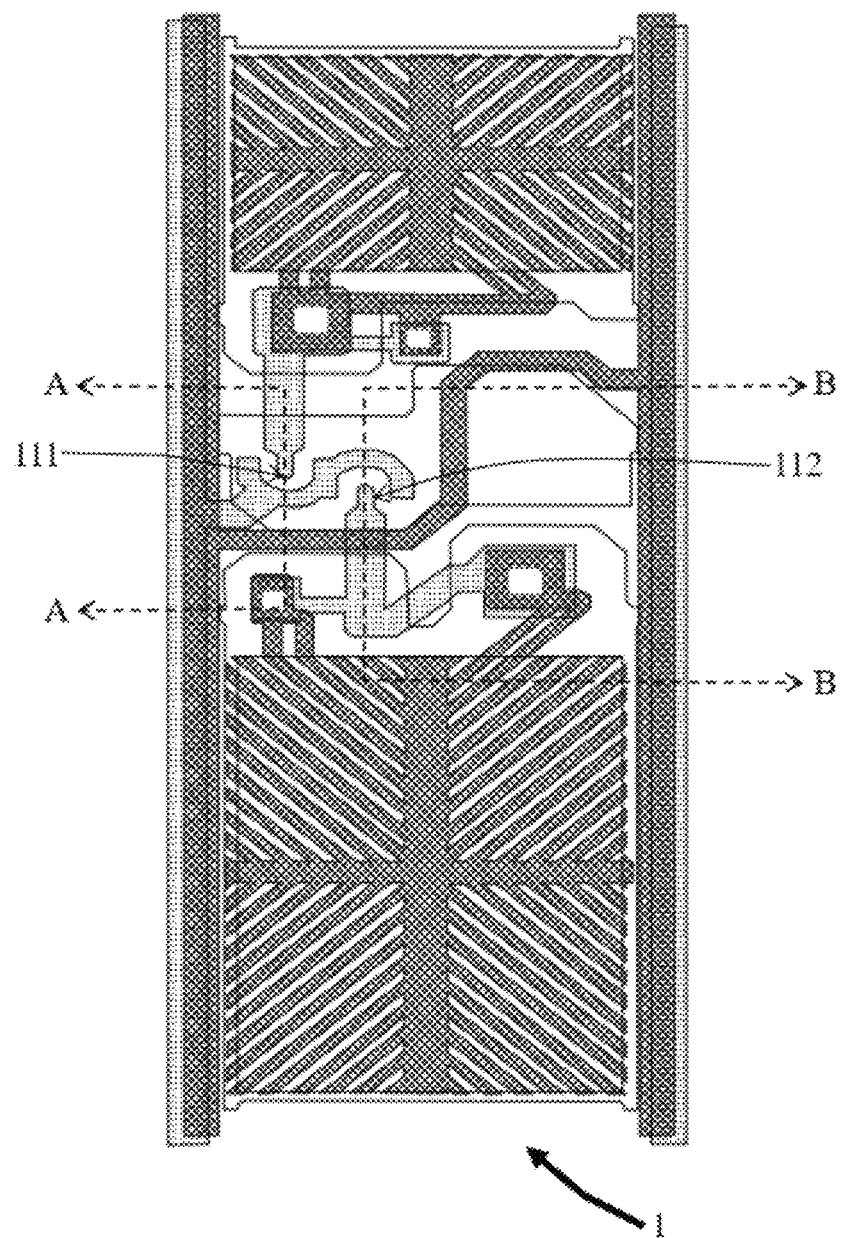
FIG. 2 is a schematic diagram of a second planar structure of the array substrate of the embodiment of the present disclosure.
Figure 3:
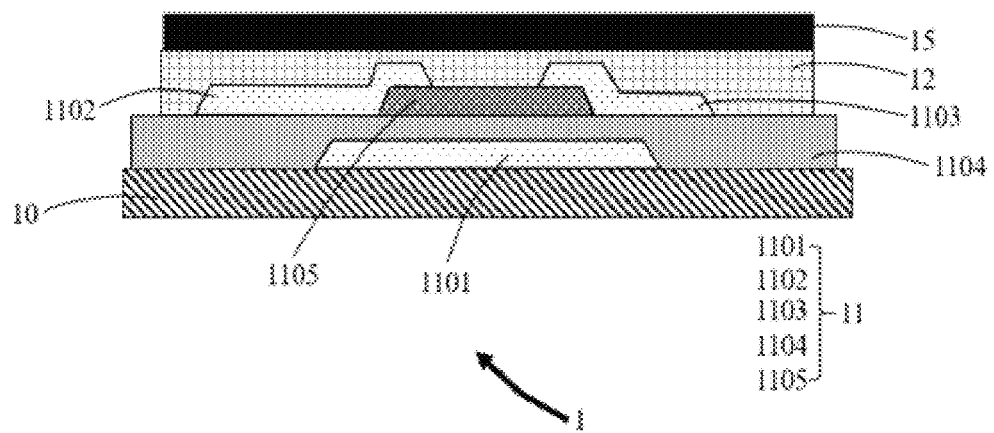
FIG. 3 is a cross sectional view taken along a section line A and a section line B in FIG. 1.

Please refer to FIG. 1 to FIG. 6, an array substrate 1 of the present disclosure includes a substrate 10, a thin film transistor layer 11, a passivation layer 12, a pixel electrode layer 13, and a color filter layer 15 that are disposed sequentially one above another. The thin film transistor layer 11 includes at least one thin film transistor. The thin film transistor is electrically connected to the first conductive layer 141. As shown in FIG. 3, the thin film transistor layer 11 includes a gate 1101, a source 1103, a drain 1102, an active layer 1105, and a gate insulating layer 1104. The drain 1102 and the source 1103 of the thin film transistor are formed by patterning the first conductive layer 141.

The passivation layer 12 includes a thin film transistor region 120 corresponding to the thin film transistor. A first via hole 121 and a second via hole 122 are formed in the thin film transistor region 120. The pixel electrode layer 13 includes a pixel electrode 130. The color filter layer 15 is provided with an opening 150. The first via hole 121 corresponds to the opening 150. The second via hole 122 is staggered from the opening 150. The pixel electrode 130 is connected to the first conductive layer 141 through the first via hole 121 and the second via hole 122.

By forming the first via hole 121 and the second via hole 122 on the passivation layer 12, and by connecting the pixel electrode 130 to the first conductive layer 141 through the two via holes, a risk of poor connection with the first conductive layer 141 due to the pixel electrode 130 being connected to the first conductive layer 141 through only one via hole and the pixel electrode 130 is broken at the via hole is reduced. The electrical connection between the pixel electrode 130 and the first conductive layer 141 is ensured, and grayscale dark spots problem is avoided.

In the embodiment of the present disclosure, material of the pixel electrode layer 13 is indium tin oxide (ITO), which ensures that it has good light transmittance and conductivity. Material of the first conductive layer 141 is a metal with good conductivity, such as aluminum or copper.

In a second embodiment of the present disclosure, as shown in FIG. 1, a thin film transistor assembly 110 includes a first thin film transistor 111 and a second thin film transistor 112. A pixel electrode 130 includes a first sub-pixel electrode 1301 and a second sub-pixel electrode 1302. A thin film transistor region 120 includes a first sub-region 1201 corresponding to the first thin film transistor 111 and a second sub-region 1202 corresponding to the second thin film transistor 112.

By dividing the pixel electrode 130 into two independent first sub-pixel electrode 1301 and second sub-pixel electrode 1302, a visual color shift or a visual chromatic aberration of a display panel at wide viewing angles can be improved.

It should be noted that the first sub-pixel electrode 1301 or the second sub-pixel electrode 1302 can be connected to the first conductive layer 141 through the first via hole 121 and the second via hole 122 correspondingly. Alternatively, both the first sub-pixel electrode 1301 and the second sub-pixel electrode 1302 can be connected to the first conductive layer 141 through the first via hole 121 and the second via hole 122.

Preferably, in the embodiment of the present disclosure, referring to FIG. 4 to FIG. 7, the passivation layer 12 is provided with the first via hole 121 and the second via hole 122 in the first sub-region 1201. The first sub-pixel electrode 1301 is connected to the first conductive layer 141 of the first thin film transistor 111 through the first via hole 121 and the second via hole 122 in the first sub-region 1201. The passivation layer 12 also includes the first via hole 121 and the second via hole 122 in the second sub-region 1202. The second sub-pixel electrode 1302 is connected to the first conductive layer 141 of the second thin film transistor 112 through the first via hole 121 and the second via hole 122 in the second sub-region 1202.

The first sub-pixel electrode 1301 is connected to the first conductive layer 141 of the first thin film transistor 111 through the first via hole 121 and the second via hole 122, and the second sub-pixel electrode 1302 is connected to the first conductive layer 141 of the first thin film transistor 112 through the first via hole 121 and the second via hole 122. When the pixel electrode 130 is divided into two independent first sub-pixel electrode 1301 and second sub-pixel electrode 1302, electrical connections between the first sub-pixel electrode 1301 and the second sub-pixel electrode 1302 and the first conductive layer 141 can be guaranteed, thereby reducing a risk of grayscale dark spots.

In the embodiment of the present disclosure, referring to FIG. 1, FIG. 2, FIG. 3, and FIG. 8, the first thin film transistor 111 and the second thin film transistor 112 are electrically connected to a second conductive layer 142. The second conductive layer 142 is disposed between the substrate 10 and the first conductive layer 141. The second conductive layer 142 includes a scan line 1422, a gate 1101 of the first thin film transistor 111, a gate 1101 of the second thin film transistor 112, and a gate common electrode line 1421. The gate common electrode line 1421 includes a first gate common electrode line 1421a and a second gate common electrode line 1421b. The gate 1101 of the first thin film transistor 111, the gate 1101 of the second thin film transistor 112, and the gate common electrode line 1421 are formed by patterning the second conductive layer 142. Preferably, material of the second conductive layer 142 is a metal with good conductivity, such as aluminum or copper.

Referring to FIG. 1, FIG. 2, FIG. 4, and FIG. 5, the first conductive layer 141 corresponding to the first thin film transistor 111 includes a drain 1102 and a first electrode 1411 that are electrically connected to each other. The second conductive layer 142 corresponding to the first thin film transistor 111 includes a second electrode 1412. A first storage capacitor 1401 is formed between the first electrode 1411 and the second electrode 1412. The first storage capacitor 1401 is disposed in the first sub-region 1201 and corresponds to a position of the first via hole 121.

Preferably, in the embodiment of the present disclosure, referring to FIG. 1 to FIG. 3, the drain 1102 of the first thin film transistor 111 and the first electrode 1411 are arranged on a same layer. That is, the first conductive layer 141 includes the drain 1102 of the first thin film transistor 111 and the first electrode 1411. Therefore, a structure of the array substrate 1 is simplified. In addition, the first conductive layer 141 also includes a data line 1416 and a source 1103 of the first thin film transistor 111. The data line 1416 and the drain 1102 and the source 1103 of the first thin film transistor 111 are formed by patterning the first conductive layer 141.

Referring to FIG. 1, FIG. 4, FIG. 5, and FIG. 6, the first sub-pixel electrode 1301 is connected to the first conductive layer 141 through the first via hole 121 and the second via hole 122 in the first sub-region 1201. In the first sub-region 1201, the first via hole 121 corresponds to the first storage capacitor 1401, and the second via hole 122 is adjacent to the first storage capacitor 1401. At the second via hole 122, the first sub-pixel electrode 1301 transmits an electrical signal to the first conductive layer 141, and then the first conductive layer 141 transmits the electrical signal to the first storage capacitor 1401.

Since the first electrode 1411 of the first storage capacitor 1401 also belongs to the first conductive layer 141, the electrical signal is transmitted in a same layer that ensures an effectiveness of electrical signal transmission. A problem of poor display of grayscale dark spots caused by breakage of the first sub-pixel electrode 1301 at the first via hole 121 or poor quality of the formed film is avoided.

Figure 4:
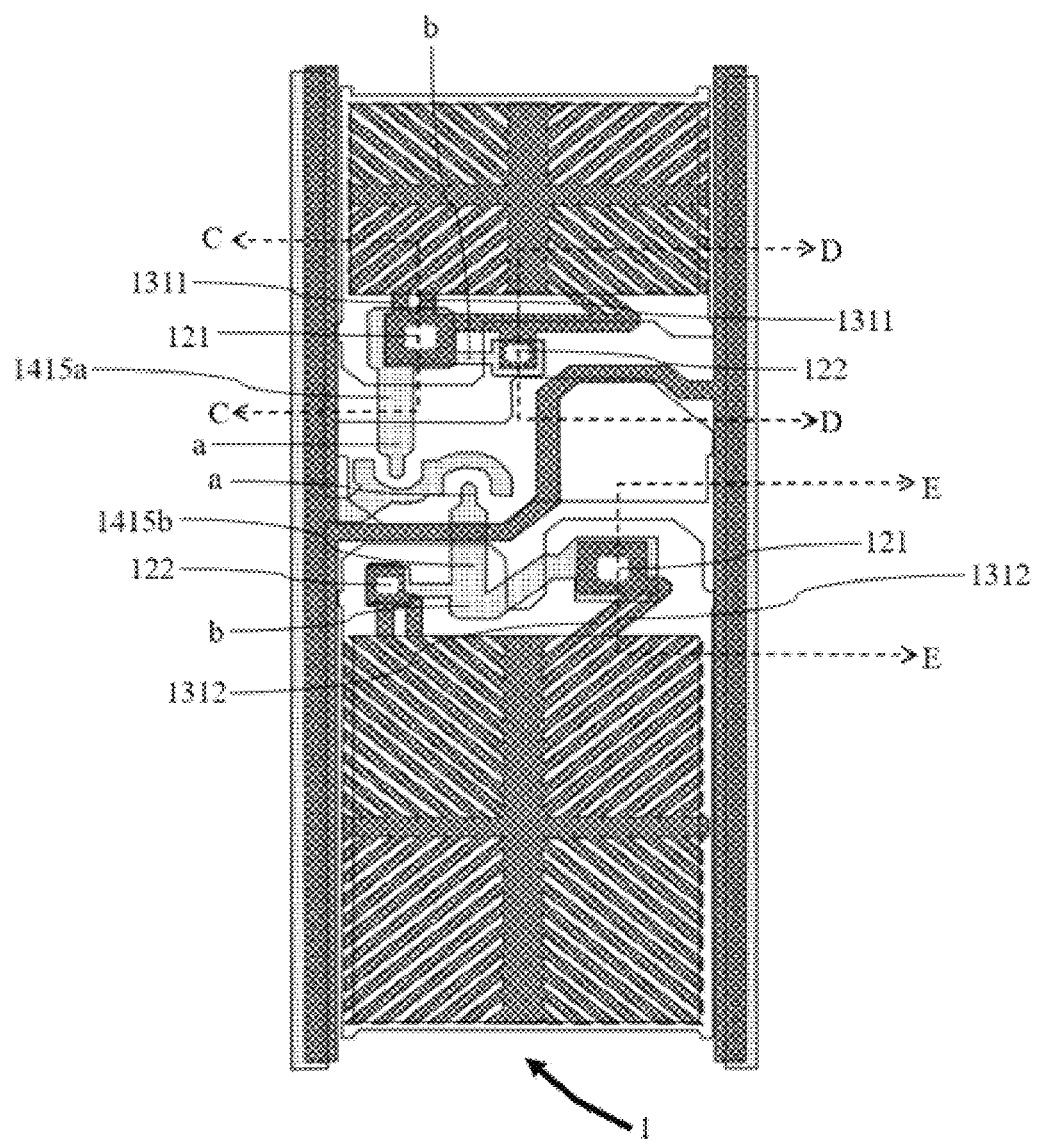
FIG. 4 is a schematic diagram of a third planar structure of the array substrate of the embodiment of the present disclosure.
Figure 5:
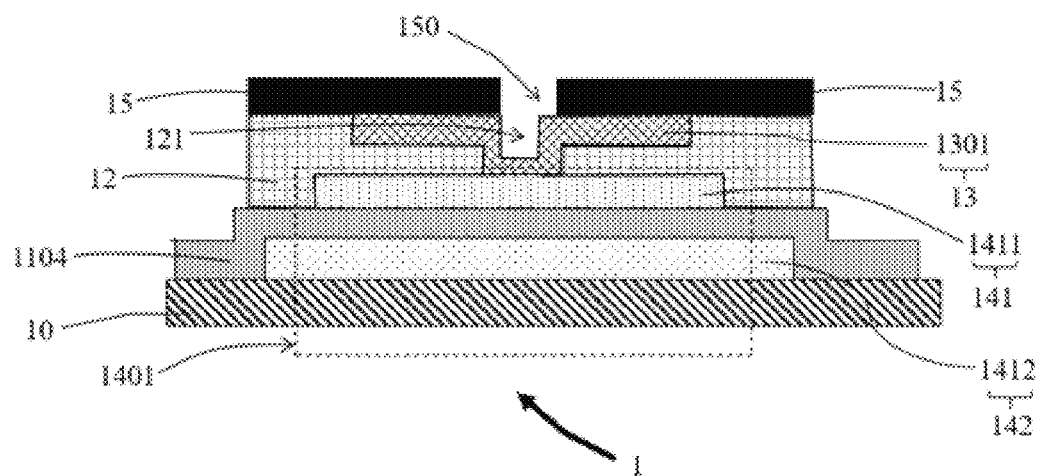
FIG. 5 is a cross sectional view taken along a section line C in FIG. 4.
Figure 6:
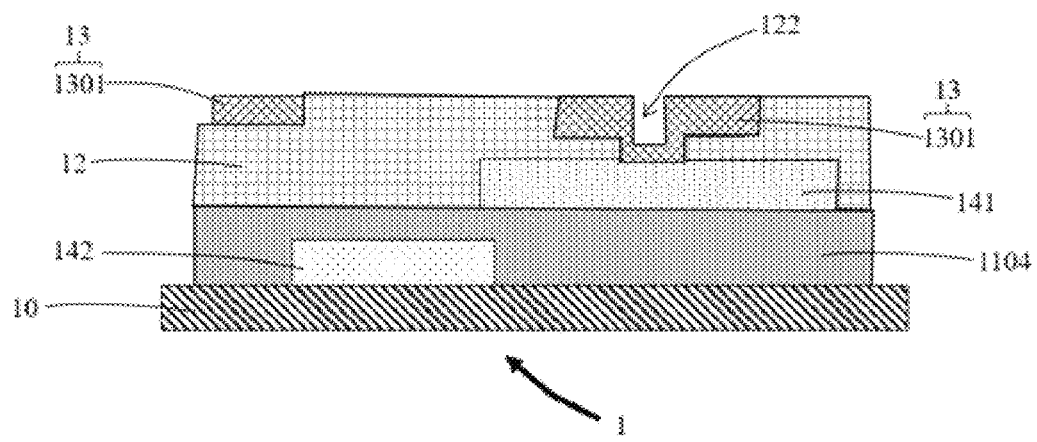
FIG. 6 is a cross sectional view taken along a section line D in FIG. 4.
Figure 7:
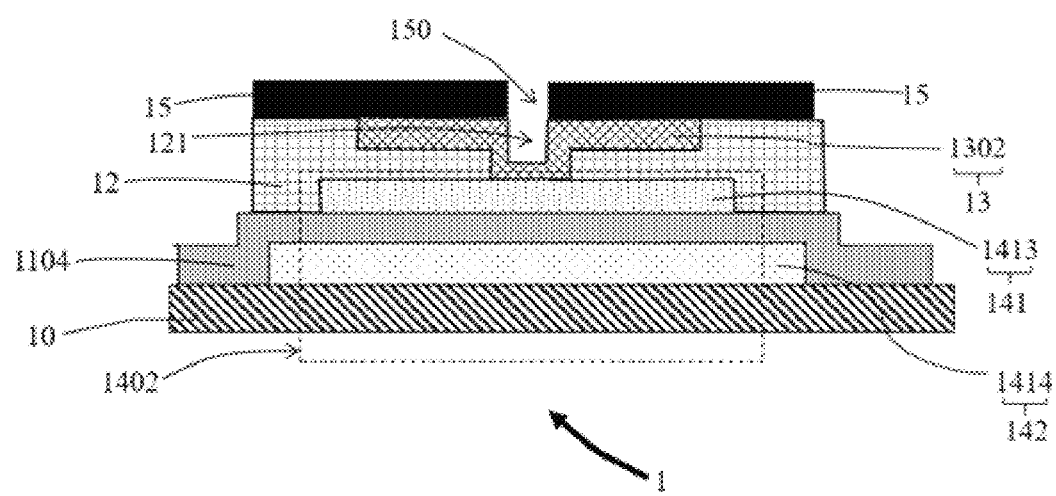
FIG. 7 is a cross sectional view taken along a section line E in FIG. 4.
Figure 8:
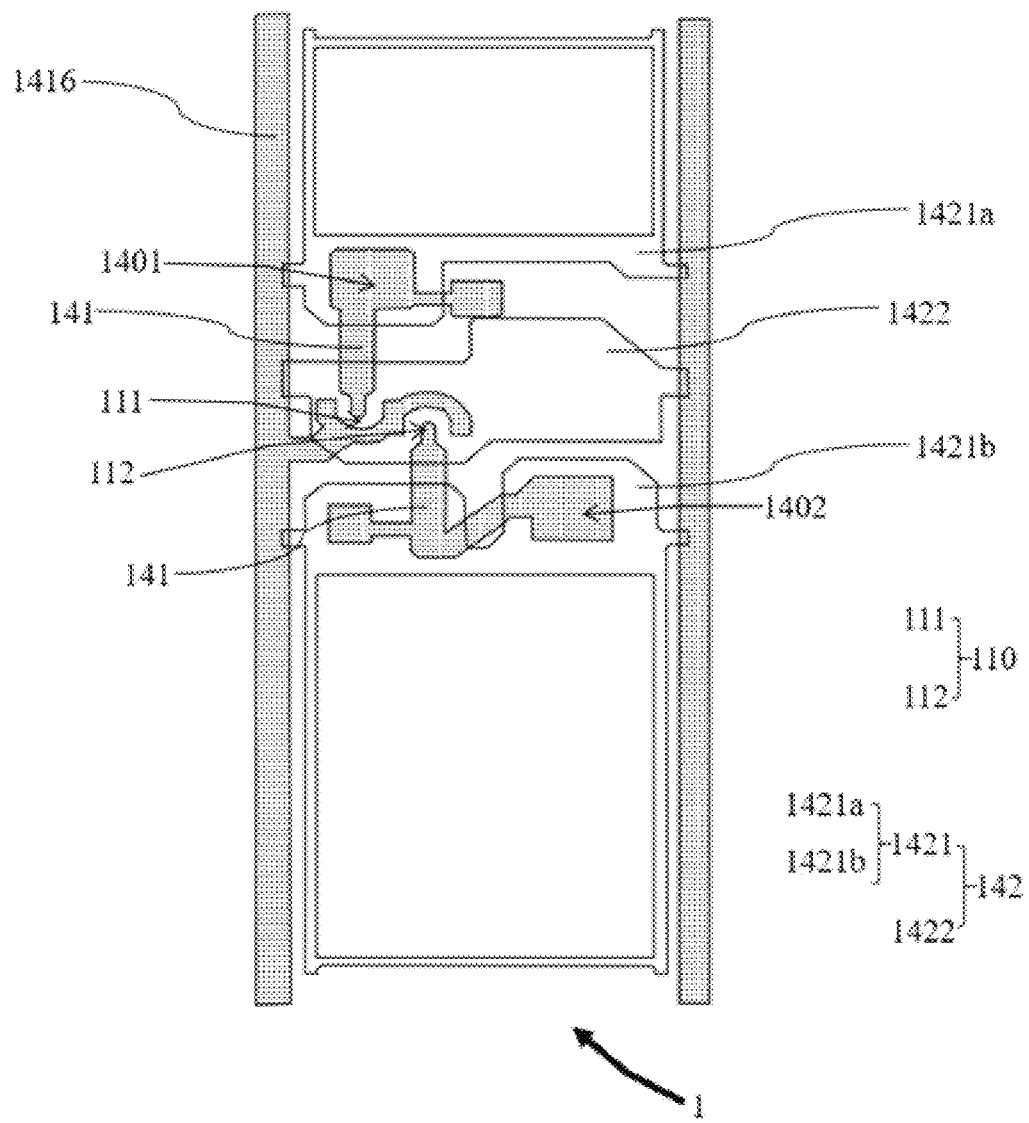
FIG. 8 is a schematic diagram of a fourth planar structure of the array substrate of the embodiment of the present disclosure.
Figure 9:
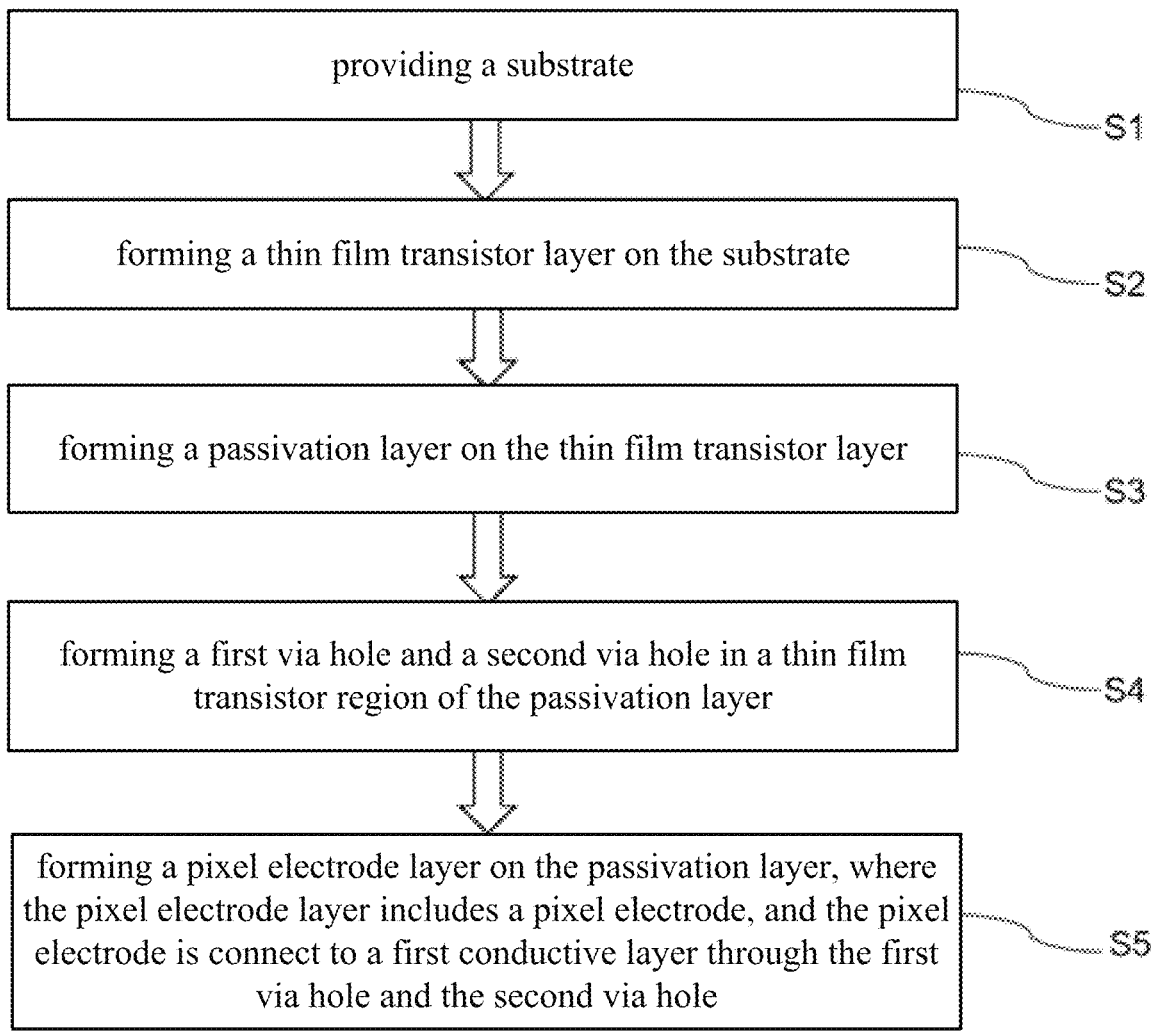
FIG. 9 is a flowchart of a manufacturing method of an array substrate of an embodiment of the present disclosure.

Referring to FIG. 1, FIG. 4, and FIG. 7, the first conductive layer 141 corresponding to the second thin film transistor 112 includes the drain 1102 and a third electrode 1413 that are electrically connected to each other. The second conductive layer 142 corresponding to the second thin film transistor 112 includes a fourth electrode 1414. A second storage capacitor 1402 is formed between the third electrode 1413 and the fourth electrode 1414. The second storage capacitor 1402 is disposed in the second sub-region 1202 and corresponds to the position of the first via hole 121.

Preferably, in the embodiment of the present disclosure, referring to FIG. 1, FIG. 2, FIG. 3, and FIG. 7, a drain 1102 of the second thin film transistor 112 and the first electrode 1411 are arranged on a same layer. That is, the first conductive layer 141 includes the drain 1102 of the second thin film transistor 112 and the third electrode 1413. Therefore, a structure and manufacturing process of the array substrate 1 can be simplified. In addition, the first conductive layer 141 also includes a source 1103 of the second thin film transistor 112. The drain 1102 and the source 1103 of the second thin film transistor 112 are formed by patterning the first conductive layer 141.

Referring to FIG. 1, FIG. 4, and FIG. 7, the second sub-pixel electrode 1302 is connected to the first conductive layer 141 through the first via hole 121 and the second via hole 122 in the second sub-region 1202. In the second sub-region 1202, the first via hole 121 corresponds to the second storage capacitor 1402, and the second via hole 122 is adjacent to the second storage capacitor 1402. At the second via hole 122, the first sub-pixel electrode 1301 transmits an electrical signal to the first conductive layer 141, and then the first conductive layer 141 transmits the electrical signal to the second storage capacitor 1402.

Since the third electrode 1413 of the second storage capacitor 1402 also belongs to the first conductive layer 141, the electrical signal is transmitted in a same layer that ensures an effectiveness of electrical signal transmission. A problem of poor display of grayscale dark spots caused by breakage of the second sub-pixel electrode 1302 at the first via hole 121 or poor quality of the formed film is avoided.

In order to prevent the first conductive layer 141 from breaking, preferably, in the embodiment of the present disclosure, a thickness of the first conductive layer 141 is greater than or equal to 430 nm.

In the embodiment of the present disclosure, the first conductive layer 141 corresponding to the first thin film transistor 111 further includes a first connection line 1415a disposed in the first sub-region 1201. One end of the first connection line 1415a is electrically connected to the drain 1102 of the first thin film transistor 111. Another end of the first connection line 1415a is electrically connected to the first sub-pixel electrode 1301 through the first via hole 121 and the second via hole 122 in the first sub-region 1201.

The first conductive layer 141 corresponding to the second thin film transistor 112 also includes a second connection line 1415b disposed in the second sub-region 1202. One end of the second connection line 1415b is electrically connected to the drain 1102 of the second thin film transistor 112. Another end of the second connection line 1415b is electrically connected to the second sub-pixel electrode 1302 through the first via hole 121 and the second via hole 122 in the second sub-region 1202.

Referring to FIG. 1 and FIG. 4, a first end a of the first connection line 1415a is electrically connected to the drain 1102 of the second thin film transistor 112. A second end b of the first connection line 1415a is electrically connected to the first sub-pixel electrode 1301 through the first via hole 121 and the second via hole 122 in the first sub-region 1201. At the second via hole 122 in the first sub-region 1201, the first sub-pixel electrode 1301 transmits the electrical signal to the first electrode 1411 of the first storage capacitor 1401.

A first end a of the second connection line 1415b is electrically connected to the drain 1102 of the second thin film transistor 112. A second end b of the second connection line 1415b is electrically connected to the second sub-pixel electrode 1302 through the first via hole 121 and the second via hole 122 in the second sub-region 1202. At the second via hole 122 in the second sub-region 1202, the second sub-pixel electrode 1302 transmits the electrical signal to the drain 1102 of the second thin film transistor 112, and then it is transmitted to the third electrode 1413 of the second storage capacitor 1402.

Preferably, in the embodiment of the present disclosure, the drain 1102 of the second thin film transistor 112 and the third electrode 1413 are arranged on a same layer, a structure of the array substrate 1 is simplified. Furthermore, the electrical signal is transmitted in a same layer that ensures an effectiveness of electrical signal transmission. A problem of poor display of grayscale dark spots caused by breakage of the second sub-pixel electrode 1302 at the first via hole 121 or poor quality of the formed film is avoided.

In the embodiment of the present disclosure, the pixel electrode layer 13 includes a plurality of first conductive lines 1311 electrically connected to the first sub-pixel electrode 1301. In order to prevent the first sub-pixel electrode 1301 from breaking at a connection point with the first conductive layer 141 and causing poor connection, preferably, referring to FIG. 1 and FIG. 4, in the embodiment of the present disclosure, the first sub-pixel electrode 1301 is connected to the first conductive layer 141 of the first thin film transistor 111 through two of the first conductive lines 1311. It should be noted that a number of the first conductive lines 1311 can also be greater than two, and the number can be increased according to actual conditions.

In the embodiment of the present disclosure, the pixel electrode layer 13 includes a plurality of second conductive lines 1312 electrically connected to the second sub-pixel electrode 1302. It is understandable that, in order to prevent the second sub-pixel electrode 1302 from being broken at a connection point with the first conductive layer 141 and causing poor connection, preferably, referring to FIG. 1 and FIG. 4, in the embodiment of the present disclosure, the second sub-pixel electrode 1302 is connected to the second conductive layer 142 of the second thin film transistor 112 through two of the second conductive lines 1312. A number of the second conductive lines 1312 between the second sub-pixel electrode 1302 and the first conductive layer 141 can also be greater than two, and a specific value can be determined according to actual conditions.

In order to ensure an effective connection between the pixel electrode 130 and the first conductive layer 141, in the embodiment of the present disclosure, a depth of the second via hole 122 is less than or equal to a depth of the first via hole 121. That is, the second via hole 122 is formed as a shallow via hole. Therefore, a risk of breakage caused by the pixel electrode 130 extending through a slop at the second via hole 122 is reduced, and the problem of grayscale dark spots is avoided.

Figure 10:
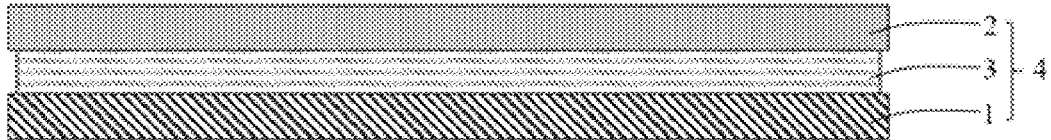
FIG. 10 is a schematic diagram of a display panel of an array substrate of an embodiment of the present disclosure.

On the other hand, the present disclosure provides a display panel 4, including the array substrate 1 in the embodiments of the present disclosure. As shown in FIG. 10, the display panel 4 includes the array substrate 1, a color filter substrate 2, and a liquid crystal layer 3. The array substrate 1 and the color filter substrate 2 are arranged relative to each other. The liquid crystal layer 3 is disposed between the array substrate 1 and the color filter substrate 2.

Finally, the present disclosure provides a manufacturing method of the array substrate 1, including the following steps.

In a step S1, a substrate is provided.

In a step S2, a thin film transistor layer is formed on the substrate. The thin film transistor layer includes a thin film transistor, and the thin film transistor is electrically connected to a first conductive layer.

In a step S3, a passivation layer is formed on the thin film transistor layer. The passivation layer includes a thin film transistor region corresponding to the thin film transistor.

In a step S4, a first via hole and a second via hole are formed in the thin film transistor region of the passivation layer.

In a step S5, a pixel electrode layer is formed on the passivation layer. The pixel electrode layer includes a pixel electrode, and the pixel electrode is connected to the first conductive layer through the first via hole and the second via hole.

The first via hole 121 and the second via hole 122 may be formed on the passivation layer 12 by a photolithography process. The pixel electrode 130 is made of ITO, and it is connected to the first conductive layer 141 through the via hole.

By forming the second via hole 122 adjacent to the first via hole 121, and by connecting the pixel electrode 130 to the first conductive layer 141 through the first via hole 121 and the second via hole 122, a risk of poor connection with the first conductive layer 141 due to the pixel electrode 130 being connected to the first conductive layer 141 through only one via hole and the pixel electrode 130 is broken at the via hole is reduced. The electrical connection between the pixel electrode 130 and the first conductive layer 141 is ensured, and grayscale dark spots problem is avoided.

The present disclosure provides the array substrate, the display panel, and the manufacturing method of the array substrate in detail above. In this specification, specific embodiments are used to illustrate principles and implementations of the present disclosure. The description of the above embodiments is only used to help understand the technical solutions of the present disclosure and its core idea. Those of ordinary skill in the art should understand that they can still modify the technical solutions described in the foregoing embodiments, or equivalently replace some of the technical features. However, these modifications or replacements do not cause an essence of the corresponding technical solutions to deviate from the scope of the technical solutions of the embodiments of the present disclosure.

What is claimed is:

1. An array substrate, comprising:
   a substrate;
   a thin film transistor layer disposed on the substrate, wherein the thin film transistor layer comprises a thin film transistor assembly, the thin film transistor assembly comprises at least one thin film transistor, and the thin film transistor is electrically connected to a first conductive layer;
   a passivation layer disposed on the thin film transistor layer, wherein the passivation layer comprises a thin film transistor region corresponding to the thin film transistor, and the passivation layer is provided with a first via hole and a second via hole in the thin film transistor region;
   a pixel electrode layer disposed on the passivation layer, wherein the pixel electrode layer comprises a pixel electrode connected to the first conductive layer through the first via hole and the second via hole; and
   a color filter layer disposed on the pixel electrode layer, wherein the color filter layer is provided with an opening, the first via hole corresponds to the opening, and the second via hole is staggered from the opening.

2. The array substrate according to claim 1, wherein the thin film transistor assembly comprises a first thin film transistor and a second thin film transistor, the thin film transistor region comprises a first sub-region corresponding to the first thin film transistor and a second sub-region corresponding to the second thin film transistor, and the pixel electrode comprises a first sub-pixel electrode and a second sub-pixel electrode; and
   the passivation layer is provided with the first via hole and the second via hole in the first sub-region, and the first sub-pixel electrode is connected to the first conductive layer through the first via hole and the second via hole in the first sub-region; and/or
   the passivation layer is provided with the first via hole and the second via hole in the second sub-region, and the second sub-pixel electrode is connected to the first conductive layer through the first via hole and the second via hole in the second sub-region.

3. The array substrate according to claim 2, wherein each of the first thin film transistor and the second thin film transistor is further electrically connected to a second conductive layer, and the second conductive layer is disposed between the substrate and the first conductive layer; and
   the first conductive layer corresponding to the first thin film transistor comprises a first electrode, the second conductive layer corresponding to the first thin film transistor comprises a second electrode, a first storage capacitor is formed between the first electrode and the second electrode, and the first storage capacitor is disposed in the first sub-region and corresponds to a position of the first via hole in the first sub-region.

4. The array substrate according to claim 3, wherein the first conductive layer corresponding to the second thin film transistor comprises a third electrode, the second conductive layer corresponding to the second thin film transistor comprises a fourth electrode, a second storage capacitor is formed between the third electrode and the fourth electrode, and the second storage capacitor is disposed in the second sub-region and corresponds to a position of the first via hole in the second sub-region.

5. The array substrate according to claim 4, wherein the first conductive layer corresponding to the first thin film transistor further comprises a first connection line disposed in the first sub-region, one end of the first connection line is electrically connected to a drain of the first thin film transistor, and another end of the first connection line is electrically connected to the first sub-pixel electrode through the first via hole and the second via hole in the first sub-region; and
   the first conductive layer corresponding to the second thin film transistor further comprises a second connection line disposed in the second sub-region, one end of the second connection line is electrically connected to a drain of the second thin film transistor, and another end of the second connection line is electrically connected to the second sub-pixel electrode through the first via hole and the second via hole in the second sub-region.

6. The array substrate according to claim 2, wherein the pixel electrode layer comprises a plurality of first conductive lines electrically connected to the first sub-pixel electrode, and the first sub-pixel electrode is connected to the first conductive layer corresponding to the first thin film transistor through at least two of the first conductive lines.

7. The array substrate according to claim 6, wherein the pixel electrode layer comprises a plurality of second conductive lines electrically connected to the second sub-pixel electrode, and the second sub-pixel electrode is connected to the first conductive layer corresponding to the second thin film transistor through at least two of the second conductive lines.

8. The array substrate according to claim 2, wherein a source and a drain of the first thin film transistor and the first conductive layer are arranged on a same layer; and/or
   a source and a drain of the second thin film transistor and the first conductive layer are arranged on a same layer.

9. The array substrate according to claim 2, wherein a thickness of the first conductive layer is greater than or equal to 430 nanometers.

10. The array substrate according to claim 3, wherein a gate of the first thin film transistor and the second conductive layer are arranged on a same layer; and/or
    a gate of the second thin film transistor and the second conductive layer are arranged on a same layer.

11. The array substrate according to claim 1, wherein a depth of the second via hole is less than or equal to a depth of the first via hole.

12. A display panel, comprising an array substrate, wherein the array substrate comprises:
    a substrate;
    a thin film transistor layer disposed on the substrate, wherein the thin film transistor layer comprises a thin film transistor assembly, the thin film transistor assembly comprises at least one thin film transistor, and the thin film transistor is electrically connected to a first conductive layer;
a passivation layer disposed on the thin film transistor layer, wherein the passivation layer comprises a thin film transistor region corresponding to the thin film transistor, and the passivation layer is provided with a first via hole and a second via hole in the thin film transistor region;
a pixel electrode layer disposed on the passivation layer, wherein the pixel electrode layer comprises a pixel electrode, and the pixel electrode is connected to the first conductive layer through the first via hole and the second via hole; and
a color filter layer disposed on the pixel electrode layer, the color filter layer is provided with an opening, the first via hole corresponds to the opening, and the second via hole is staggered from the opening.

13. The display panel according to claim 12, wherein the thin film transistor assembly comprises a first thin film transistor and a second thin film transistor, the thin film transistor region comprises a first sub-region corresponding to the first thin film transistor and a second sub-region corresponding to the second thin film transistor, and the pixel electrode comprises a first sub-pixel electrode and a second sub-pixel electrode; and
the passivation layer is provided with the first via hole and the second via hole in the first sub-region, and the first sub-pixel electrode is connected to the first conductive layer through the first via hole and the second via hole in the first sub-region; and/or
the passivation layer is provided with the first via hole and the second via hole in the second sub-region, and the second sub-pixel electrode is connected to the first conductive layer through the first via hole and the second via hole in the second sub-region.

14. The display panel according to claim 13, wherein each of the first thin film transistor and the second thin film transistor is further electrically connected to a second conductive layer, and the second conductive layer is disposed between the substrate and the first conductive layer; and
the first conductive layer corresponding to the first thin film transistor comprises a first electrode, the second conductive layer corresponding to the first thin film transistor comprises a second electrode, a first storage capacitor is formed between the first electrode and the second electrode, and the first storage capacitor is disposed in the first sub-region and corresponds to a position of the first via hole in the first sub-region.

15. The display panel according to claim 14, wherein the first conductive layer corresponding to the second thin film transistor comprises a third electrode, the second conductive layer corresponding to the second thin film transistor comprises a fourth electrode, a second storage capacitor is formed between the third electrode and the fourth electrode, and the second storage capacitor is disposed in the second sub-region and corresponds to a position of the first via hole in the second sub-region.

16. The display panel according to claim 15, wherein the first conductive layer corresponding to the first thin film transistor further comprises a first connection line disposed in the first sub-region, one end of the first connection line is electrically connected to a drain of the first thin film transistor, and another end of the first connection line is electrically connected to the first sub-pixel electrode through the first via hole and the second via hole in the first sub-region; and
the first conductive layer corresponding to the second thin film transistor further comprises a second connection line disposed in the second sub-region, one end of the second connection line is electrically connected to a drain of the second thin film transistor, and another end of the second connection line is electrically connected to the second sub-pixel electrode through the first via hole and the second via hole in the second sub-region.

17. The display panel according to claim 13, wherein the pixel electrode layer comprises a plurality of first conductive lines electrically connected to the first sub-pixel electrode, and the first sub-pixel electrode is connected to the first conductive layer corresponding to the first thin film transistor through at least two of the first conductive lines.

18. The display panel according to claim 17, wherein the pixel electrode layer comprises a plurality of second conductive lines electrically connected to the second sub-pixel electrode, and the second sub-pixel electrode is connected to the first conductive layer corresponding to the second thin film transistor through at least two of the second conductive lines.

19. The display panel according to claim 13, wherein a source and a drain of the first thin film transistor and the first conductive layer are arranged on a same layer; and/or
a source and a drain of the second thin film transistor and the first conductive layer are arranged on a same layer.

20. The display panel according to claim 14, wherein a gate of the first thin film transistor and the second conductive layer are arranged on a same layer; and/or
a gate of the second thin film transistor and the second conductive layer are arranged on a same layer.

* * * * *